United States Patent [19]

Russer

[11] 4,101,845
[45] Jul. 18, 1978

[54] METHOD OF AND ARRANGEMENT FOR PRODUCING COHERENT MODE RADIATION

[75] Inventor: Peter Russer, Ulm (Donau), Germany

[73] Assignee: Licentia Patent-Verwaltungs-G.m.b.H., Frankfurt am Main, Germany

[21] Appl. No.: 670,824

[22] Filed: Mar. 26, 1976

[30] Foreign Application Priority Data

Mar. 29, 1975 [DE] Fed. Rep. of Germany ....... 2514140
Oct. 31, 1975 [DE] Fed. Rep. of Germany ....... 2548796

[51] Int. Cl.² .................................................. H01S 3/10
[52] U.S. Cl. .......................... 331/94.5 M; 331/94.5 H
[58] Field of Search ................. 331/94.5 H, 94.5 M, 331/94.5 P, 94.5 C, 94.5 T, 94.5 K, 94.5 PE; 332/7.51

[56] References Cited

U.S. PATENT DOCUMENTS

| 3,295,911 | 1/1967 | Ashkin et al. | 331/94.5 M X |
| 3,303,431 | 2/1967 | Fowler | 331/94.5 H |
| 3,434,776 | 3/1969 | Kern | 350/96 |
| 3,477,041 | 11/1969 | Steele et al. | 331/94.5 M X |
| 3,517,337 | 6/1970 | Shah | 331/94.5 K X |
| 3,815,045 | 6/1974 | Ito | 331/94.5 M |
| 3,999,146 | 12/1976 | Lang et al. | 331/94.5 M |

OTHER PUBLICATIONS

P. S. Zory, "Zero Mode Diode Laser", IBM Tech. Discl. Bull., vol. 16, No. 9, Feb. 1974, p. 3127.

Primary Examiner—Stanley D. Miller, Jr.
Assistant Examiner—James W. Davie
Attorney, Agent, or Firm—Spencer & Kaye

[57] ABSTRACT

A method of producing coherent mode radiation comprises passing direct currents through a pair of injection lasers optically coupled together but controllable separately, one laser of good optical quality (Q-factor) and spectral purity being excited above its threshold and the other laser having a lower optical quality and having a modulated current superimposed on its dc current. An arrangement suitable for carrying out such a method is also provided.

17 Claims, 20 Drawing Figures

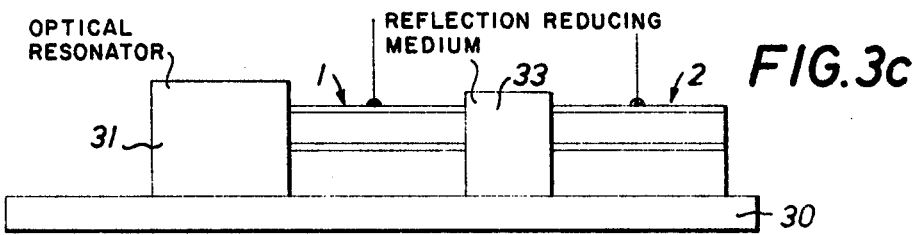
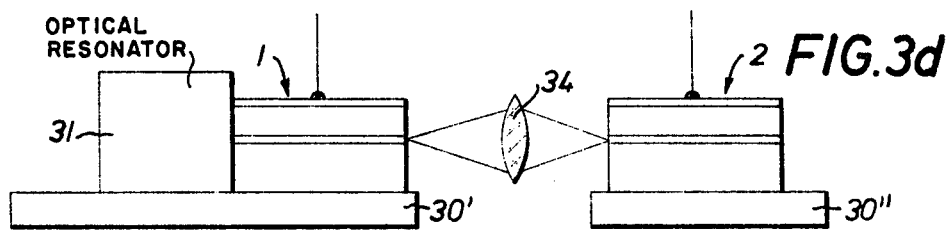
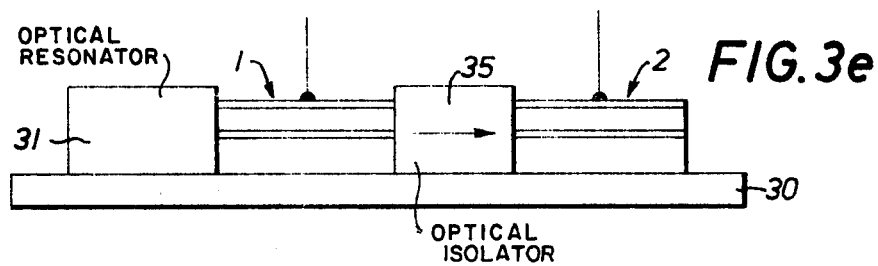
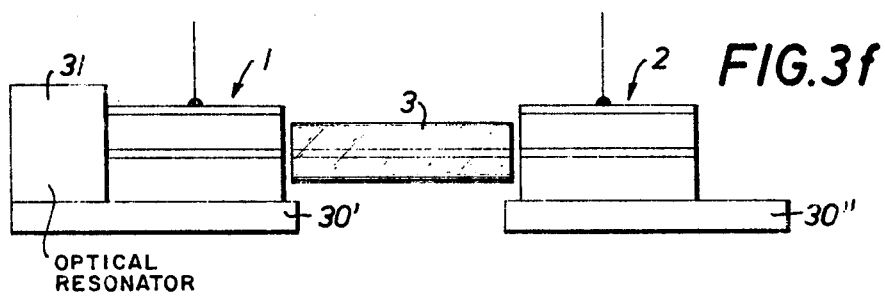
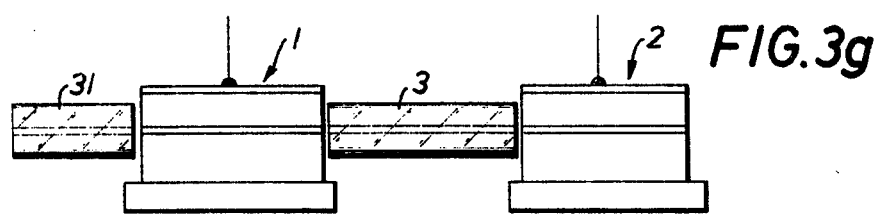

METHOD OF AND ARRANGEMENT FOR PRODUCING COHERENT MODE RADIATION

BACKGROUND OF THE INVENTION

The invention relates to a method of and arrangement for producing coherent pure mode radiation modulated at a high bit rate, having two optically coupled injection lasers which may be controlled independently of one another.

For optical transmission of information via glass fibre light waveguides, semiconductor injection lasers are considered to be particularly suitable. Besides a series of other advantages, injection lasers have a direct modulability up to very high bit rates. For optical transmission of information via long monomode light waveguides at gigabit rates not only an appropriately rapid modulability is necessary, but also a narrow line of emission of the laser. If the laser is not pure mode, then considerable distortion of the propagation time occurs on monomode light waveguides, which distortion makes transmission of information at gigabit rates impossible over several km line length.

For rapid direct modulation, only those injection lasers can be considered which are biased above the threshold, since otherwise a delay of some nanoseconds occurs with each modulation pulse between the electrical pulse supplied to the laser and the optical output pulse. If the laser is biased above the threshold, then there is no switch on delay time, with a sudden change in the injection current the light intensity only adjusts to a new level, however with damped natural oscillations. In the interest of a rapid digital modulability, these natural oscillations should be very heavily damped. Decisive for the damping of the natural oscillations is the proportion of spontaneous emission in the emission of the oscillating modes. With monomode lasers, the proportion of spontaneous emission is very low and the natural oscillations decay only very slowly. In lasers in which a larger proportion of modes are energized, the spontaneous emission plays a greater part. The more rapid transient behaviour caused thereby acts positively; these lasers are also unsuitable however because of their wide spectrum. For largely physical reasons it appears therefore impossible to use a conventional injection laser as a directly modulatable optical transmitter for the highest bit rates.

SUMMARY OF THE INVENTION

It is an object of the invention to provide a method for producing coherent mode pure radiation modulated at a high bit rate, having two optically coupled injection lasers which may be independently controlled.

According to a first aspect of the invention, there is provided a method of producing coherent mode radiation comprising passing a direct current through a first injection laser of good optical quality (a-factor) and spectral purity to excite said first injection laser above its threshold value and passing a direct current modulated by a superimposed modulation current through a second injection laser of a lower optical quality than said first injection laser, but optically coupled thereto.

Further according to this aspect of the invention, there is provided a method of producing coherent mode pure radiation modulated at a high bit rate, having two injection lasers which may be controlled separately but are optically coupled, comprising passing a direct current through a first injection laser having good optical quality and good spectral purity of its initial radiation, the direct current being such that said first injection laser is biased above the threshold value, and biasing a further injection laser having a low optical quality in comparison to the first injection laser, by a direct current passing through it and controlling said further injection laser additionally by a modulation current superimposed on this direct current.

According to a second aspect of the invention, there is provided an arrangement for producing coherent mode radiation comprising a first injection laser of good optical quality and spectral purity, a second injection laser of lower optical quality than said first injection laser and coupled to said first injection laser for receiving radiation emitted by said first injection laser and contacts for each said first and second injection lasers for enabling independent control of each said laser.

BRIEF DESCRIPTION OF THE DRAWINGS

The invention will now be described in greater detail, by way of example, with reference to the drawings, in which:

FIG. 3c shows the provision of a resonator and a coupling arrangement for the lasers;

FIG. 3d shows an arrangement with separated lasers coupled by a lens;

FIG. 3e shows an arrangement with the lasers coupled by an optical isolator

FIG. 3f shows an arrangement with the lasers coupled by a light waveguide element;

FIG. 3g shows an arrangement in which the lasers are coupled by a light waveguide element and a light waveguide element is also used as an external resonator;

DESCRIPTION OF THE PREFERRED EMBODIMENTS

In a preferred embodiment of the invention, in a method of the type described in greater detail above, a first injection laser having a high optical efficiency or quality Q and high spectral purity of its radiation has a direct current flowing constantly therethrough such that it is energized above the threshold value and that a further injection laser coupled to the first injection laser optically, having a low optical efficiency or quality in comparison to the first injection laser, is biased on the one hand by a direct current flowing through it and additionally has a modulation current superimposed on the direct current.

Production of coherent mode pure radiation modulated at a high bit rate is made possible by means of the invention. The radiation is particularly easily transmitted as an optical signal, particularly in optical information transmission systems with so-called monomode light glass fibres as a transmission medium.

Figure 1:
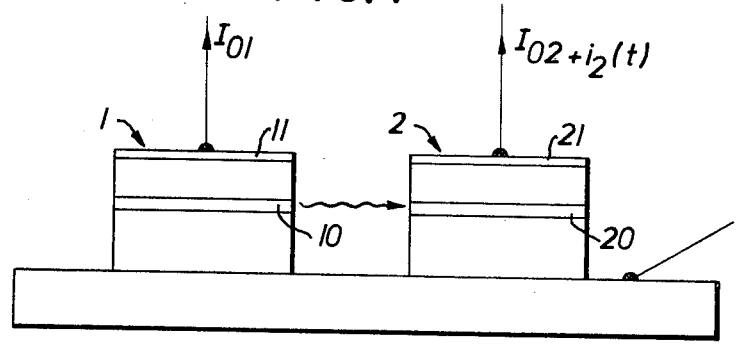
FIG. 1 is a diagrammatic view of a first arrangement in accordance with the invention.

Referring to the drawings, a first arrangement for carrying out the method in accordance with the invention is shown schematically in FIG. 1. It comprises two semiconductor injection lasers, which are optically coupled but electrically controllable separate from one another, in which an operating current is supplied to each of the two injection lasers via at least one contact which is not common to both.

Optically coupled injection lasers are already known from IEEE Journal of Quantum Electronics, QE-4, pp. 885–864 (1968), Solid State Electronics, 7, p. 707 (1964) or from the German Auslegeschrift No. 2,025,920. It is, however, the coupling of one laser of high resonant quality (Q-factor) to a laser of low resonant quality (Q-factor) which is not disclosed in these publications. In the two preliminary publications first named, the aim is to create a rapid bistable construction element. In German Auslegeschrift No. 2 025 920 a laser biased above the threshold is optically coupled to a laser biased below the threshold, wherein the second laser, as a saturable absorber, lies in the optical feedback path of the first laser, whereby oscillation is produced.

In the solution in accordance with the invention, the first laser has a resonator of high optical quality, which may be energized, by special measures, for example distributed feedback or external resonator, in a single longitudinal and transverse mode and which is pumped by a direct current greater than the threshold current of the laser 1. Laser 2 on the other hand has a resonator of lower optical quality which, for example, may be achieved by removing the reflection from one or both end surfaces. It is biased below or even above the threshold and in addition directly modulated with a modulation signal of high bit rate. The direct current $I_{01}$, is impressed on the laser 1, the total of the direct current $I_{02}$ and the modulation current $i_{2(t)}$ is impressed on the laser 2.

The arrangement acts in the following manner: the monochromatic radiation produced by laser 1 is amplified in laser 2, if the latter is biased below the threshold or synchronizes laser 2 to the optical frequency of laser 1, if laser 2 is biased above the threshold. Furthermore, the density of electrons is reduced in the active zone 20 of laser 2 by radiation of light from laser 1 until other modes are enabled to oscillate in laser 2. Laser 2, which for its part does not need to be mode pure without additional radiation, is caused to oscillate in monomode by the energizing laser 1. Furthermore, the external radiation serves to damp the build up of laser 2. Thus two desired effects are superimposed which leads to the already good modulation conditions due to the low resonant quality of laser 2 being improved still further by radiation.

Figure 2:
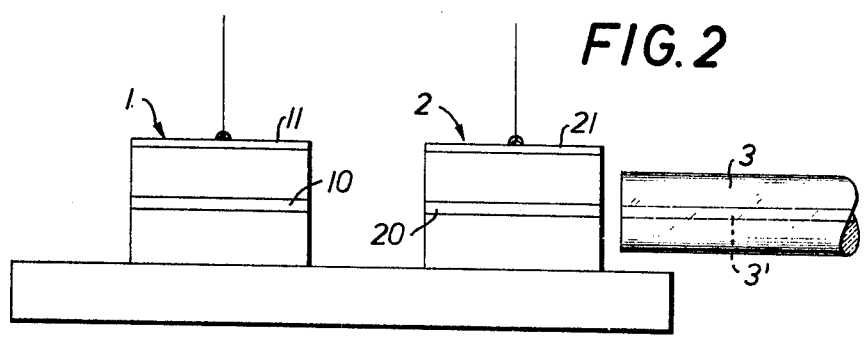
FIG. 2 is a view similar to FIG. 1, but showing the second laser coupled to a photoconductive fibre.

The arrangement shown in FIG. 1 of two optically coupled injection lasers, which may be controlled independently of one another, is particularly good because of its advantageous properties as a light emitter to be used as a light transmitter in broadband optical information transmission systems. As a transmission medium in such information transmission systems, dielectric light waveguides should be used and in particular especially so-called monomode waveguides, which consist of a sleeve area and a core area having a diameter of the order of magnitude of the length of the light wave. Monomode waveguide fibres are distinguished in fact by particularly favourable transmission properties. In FIG. 2 the coupling of the optically coupled injection laser pair 1,2, shown in FIG. 1, to the transmission medium of an optical fibre is shown. An optical waveguide fibre designated 3 is arranged, at the smallest possible distance, adjacent the coupling surface of the laser 2, such that the core area 3' of the fibre and the active region 20 of the laser 2 are directly opposite to one another. In this manner, the light signal sent out by laser 2 and modulated at high bit rates may be coupled into the light waveguide 3 with low coupling losses. Coupling of a light waveguide to the pair of semiconductor injection lasers acting as light emitter, shown in this Figure, may be carried out in the same manner, even in the embodiments shown in the further Figures. This coupling of a light waveguide to the injection lasers is not shown in detail in the other embodiments.

In this embodiment laser 1 is a double heterostructure diode with a stripe geometry contact. It has a length of approximately 400 microns and about the same width. The thickness of the active region is about 0.5 micron. The width of the stripe contact 11 is about 10 microns. The threshold current of such a laser is approximately 200 milliamperes. The spontaneous electron lifetime is about 5 nsec, the photon-lifetime is about 1 picosec. The emission wavelength lies at 8500 Angstroem units.

The length of laser 2 is somewhat different from that of laser 1 so that the spacing of the longitudinal modes is different in both devices. The photon lifetime in laser 2 is less than that in laser 1. This is accomplished by an anti-reflection coating on one or both end surfaces of this laser. While laser 1 is biased far above its threshold value, laser 2 is biased below or just above its threshold. Laser 2 is additionally modulated with a pulse code modulation signal at a bit rate of about 1 gigabit per second. The modulation current is produced for example by a step recovery diode multiplexer (see: P. Russer, J. Gruber "Hybrid Integrated Multiplexer with Step Recovery Diodes for the Gbit/s Range", Wissenschaftliche Berichte AEG-Telefunken, Nr. 2/3, 1975 pages 55 – 60, 147).

The width of this laser element 2 well as the width of its stripe contact, the thickness of its active layer and its spontaneous electron lifetime have the same values as in laser 1.

In the embodiment of FIGS. 3a to 3g means are shown with which, in an advisable manner, optimum coupling between the first and second laser of the optically coupled pair of injection lasers according to FIG. 1, which is optimum for operation, may be adjusted. In addition, means are provided with which, in an advantageous manner, it may be achieved that the initial radiation of one of the two coupled lasers is as mode pure as possible.

Figure 3A:
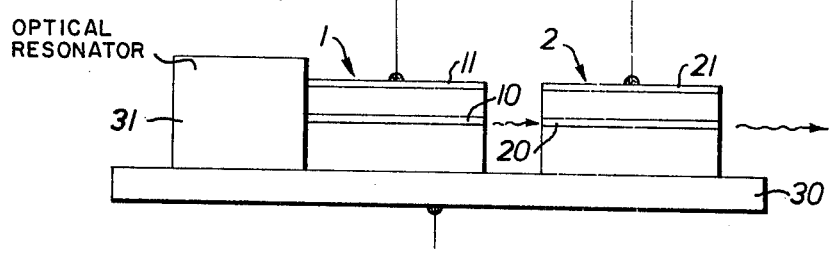
FIG. 3a is a view similar to FIG. 1, but showing an external resonator for the first laser.

For example, the lasers 1 and 2 may be manufactured so as to be completely separated from one another and they may only be arranged on a common baseplate 30 (FIG. 3a) after the manufacturing process at the same time the baseplate 30 is heat-absorbent for removing the heat arising while the semiconductor lasers are operating, and act as the electrical contact, common to both lasers, which supplies the operating current. The independent electrical control of the two lasers is made possible by further separate contacts 11,21, each of the two lasers being provided with one of these. According to the distance between the two lasers 1,2 when fixed to the baseplate 30, a particular degree of coupling, which is advantageous for operation, between the laser 1 and laser 2 may be set up. The radiation emitted by the active region 10 of the laser 1 influences the behaviour of laser 2 in the manner already described above. Its initial radiation may in turn be coupled into a light waveguide 3 in the manner shown in FIG. 2. As long as a mode pure emission of the laser 1 cannot be achieved by its construction, the type of modes which may be energized in a semiconductor laser may, as is known, be influenced by its geometric dimensions in a particular manner. Means, desirably arranged outside the body of the semiconductor laser, are provided for selection of particular modes. In FIG. 3a an external resonator designated 31 is provided, for example, arranged directly against the semiconductor body of the laser 1. This resonator may, for example, consist of an arrangement known per se of plane or concave mirrors (Fabry-Perot). Such a resonator suppresses the modes of the adjacent laser 1 not corresponding to its resonance frequency.

Figure 3B:
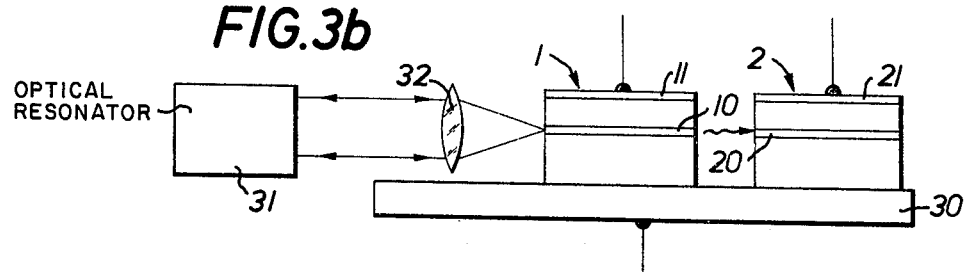
FIG. 3b shows the external resonator of FIG. 3a coupled to the first laser by a lens.

As is known, semiconductor injection lasers have extremely small dimensions. In some circumstances, difficulties may arise from this when coupling to an outer resonator 31, because this cannot be manufactured with the same small dimensions. Therefore it is advantageous, as shown in FIG. 3b, if an optical system element, for example, a collector lens 32, which makes coupling-in of light between resonator 31 and laser 1 easier, is inserted between resonator 31 and laser 1 which can thus be arranged at a distance from one another.

At the end surfaces of the spaced lasers 1 and 2, reflections occur which could cause, in some circumstances, influencing of the optical coupling between the lasers in an undesirable manner. As shown in FIG. 3c, an uncontrollable influence on the optical coupling between the lasers may be reduced in an advantageous manner by filling the intermediate space between the lasers with a medium 33 which reduces reflection.

In certain applications it may be advantageous if, besides the optical coupling between both lasers of the pair of semiconductor injection lasers necessary in any case, any additional thermal or electrical coupling can be dispensed with. This may take place by means of completely separate arrangements of the two semiconductor lasers on individual heat absorbers and by means of completely separate operating current supply lines. These measures may, in some circumstances, result in a larger distance between the two lasers, so that sufficient optical coupling between the two lasers can no longer be achieved. In such an embodiment, an adequate optical coupling is achieved in an advantageous manner by means of image-producting optical means which are arranged (FIG. 3d) in the path of the rays between laser 1 and laser 2. For example, a collecting lens 34 may be used. In all embodiments of the arrangement for carrying out the method in accordance with the invention, an attempt is being made purely to bring about an effect on the behaviour of laser 2 by means of the initial radiation of laser 1. A reaction by the last-named laser 2 on laser 1 is on the other hand undesirable and should be suppressed where possible. This may be achieved in an advantageous manner (FIG. 3e) in that an optical isolator 35 may be inserted between the spaced lasers 1 and 2, which facilitates propagation of the light only in the preferred direction (arrow). These optical isolators, which operate for example according to the Faraday effect, are known per se.

Besides the example of embodiment shown in FIG. 3c already, particularly stable coupling relationships may be advantageously achieved in spaced lasers in that a light waveguide element 3 is inserted between the individual lasers 1 and 2 (FIG. 3f).

A resonator was provided for mode selection external to the laser in all the previously described embodiments of FIGS. 3a to 3f, said resonator consisting of individual mirrors, for example similar to a Fabry-Perot reference standard. A resonator consisting of individual mirrors however demands careful adjustment, which is also subject to variations with respect to time. An embodiment of an arrangement which has a particularly safe operation is one in which the external resonator for mode selection also consists of a light waveguide element 31 (FIG. 3g). The resonance frequency of such a resonator is determined substantially by the length of the element 31 of the light waveguide.

Figure 4:
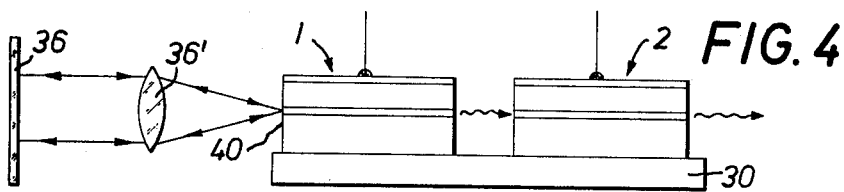
FIG. 4 shows an arrangement in which the resonator is formed by a combination of one surface of the first laser and a plane mirror.
Figure 5:
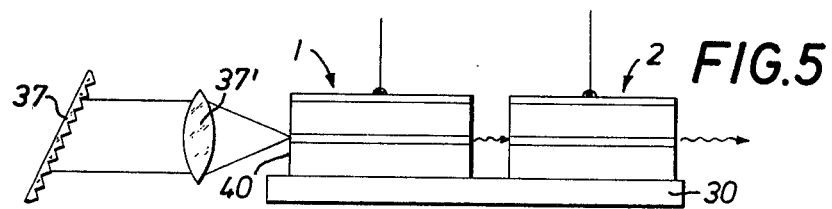
FIG. 5 shows an arrangement in which the resonator is formed by a combination of one surface of the first laser and a diffraction grating.

In a manner known per se (Applied Physics Letters 23, No. 1, (1973), pages 25 to 27), a resonator may be built up which is suitable for mode selection in the manner such that an end surface 40 of the semiconductor laser 1 itself is used as a resonator mirror (FIG. 4, FIG. 5). A flat mirror 36 (FIG. 4) or a diffraction grating 37 (FIG. 5) having a still higher selection capability may be used as a further limiting surface of an external resonator in an advantageous manner. An optical system element 36′,37′ (collector lens) arranged in the resonator acts to match the cross-section of the rays to the different limiting surfaces of the external resonator.

Figure 6:
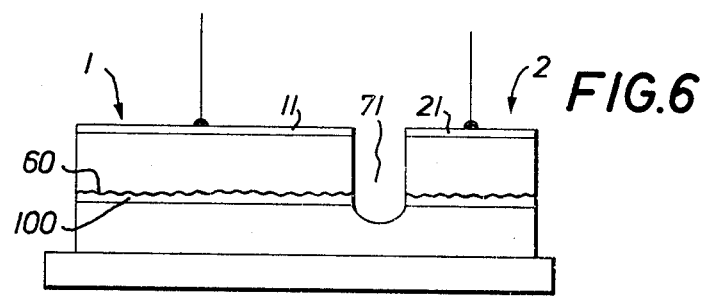
FIG. 6 shows an arrangement with distributed feedback using a depression or recess between lasers.

There is a further advantageous method for achieving a mode pure emission in laser 1, which is to use a laser with distributed feedback (FIGS. 6,7) particularly with monolithic integration of laser 1 and laser 2 on a single substrate. In this manner the problems arising from coupling to an external resonator may be avoided.

Lasers with distributed feedback are known already from Applied Physics Letters, 25 (1974), pp. 200-201.

Distributed feedback may for example be achieved by means of an active region 100 of a semiconductor laser, said region being provided with a periodic structure 60,70. Between laser 1 and laser 2 there exists an etched or sawn depression 71 for mutual separation. The end surfaces of the lasers do not need to have a high quality, as no reflecting surfaces are required at the end because of the distributed feedback and in laser 2 a low resonator quality is desired.

Figure 7:
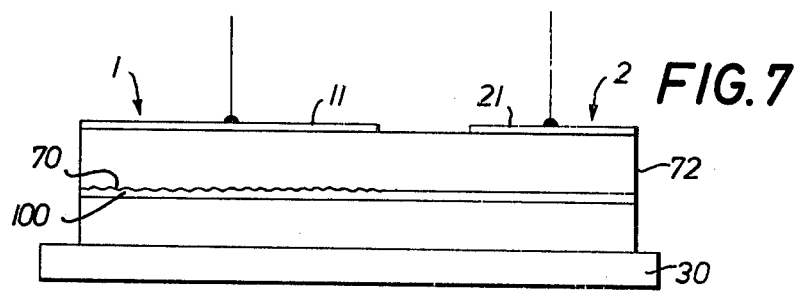
FIG. 7 shows an arrangement with distributed feedback but without a depression or recess between lasers.

As with distributed feedback the end surfaces of the laser 1 and laser 2 do not have to fulfil any function, the notch between laser 1 and laser 2 may be completely dispensed with. Then the embodiment shown in FIG. 7 is reached. It is advisable for the right-hand end surface 72 of laser 2 to be made non-reflective in order to achieve a particularly low resonator quality in laser 2. In the extreme case, if the end surface 72 is nearly complete without reflection, in the arrangement according to FIG. 7, no oscillations whatsoever may be energized in laser 2. Laser 2 then only operates more as an optical amplifier for the radiation emitted by laser 1.

In order to explain the modulation behaviour of laser 1 when using the method in accordance with the invention, light output and density of electrons are calculated in dependence on injection current and the natural frequency and damping constant of the natural oscillations of the laser 2, biased with a direct current $I_o$, in the case of small signal energization of natural oscillations. Thus, in order to simplify the calculation some ideal hypotheses are made. First of all, only the case of monomode is examined. From the result it may be concluded that the hypothesis of a case of monomode is justified in the radiation of coherent light into the laser 2. Furthermore, the effect of the coherent radiation coming from laser 1 is examined on the behaviour of laser 2, but not the reaction of the radiation of laser 2 on laser 1. This approximation is permissible if the two lasers are weakly coupled, laser 1 has a higher optical quality than laser 2 and laser 1 is pumped strongly while laser 2 on the other hand is pumped only weakly. (In the extreme case, if laser 2 is rendered non-reflective at the end surfaces or in FIG. 7 at the right-hand end surface 72 to the extent that there is no longer any reflection, laser 2 would only amplify the light emitted by laser 1 when passing through laser 2 and would not even emit any radiation towards laser 1. This case is however excluded here since the balance equations used subsequently are not usable here). Furthermore, it is assumed that the lifetime of the photons is sufficiently large for the balance equations to be usable. The spontaneous emission is not taken into consideration in laser 2 either, since laser 2 is first of all energized by the externally radiated coherent radiation of laser 1 and not by its own spontaneous emission.

Of the pre-conditions given, it only remains to solve the balance equations for laser 2, wherein the balance equations are distinguished from those known from the Literature on the subject by an exciting term in the photon equation. The balance equations are:

$$dn/dt = I/eFd - n/\tau_1 - gns, \quad (1)$$

$$ds/dt = K - s/\tau_2 + Fdgns, \quad (2)$$

wherein $n$ is the electron density, $s$ is the number of photons, I is the injection current, K is the proportion of photons injected per unit of time by laser 1, $e$ is the electron charge, F the area and $d$ the thickness of the active region of the laser, $\tau_1$ is the lifetime of the electrons in the active region owing to spontaneous recombination, $\tau_2$ is the lifetime of the photons and $g$ is a coeffecient, which states the strength of the stimulated emission in a bilinear approximation. The threshold current of the laser is:

$$I_{th} = e/g\tau_1\tau_2. \quad (3)$$

with the substitutions $$X = es/I_{th}\tau_2. \quad (4)$$

$$Z = Fdg\tau_2 n. \quad (5)$$

$$\eta = I/I_{th} \quad (6)$$

$$\xi = I_{th} \cdot K \quad (7)$$

the normalized balance equations $$\tau_1 dz/dt = \eta - z - xz \quad (8)$$

$$\tau_2 dx/dt = \xi - x + xz \quad (9)$$

are obtained.

Of the inserted normalized values, $\eta$ is the injection current normalized to the threshold current, $x$ is the number of photons normalized to the number of photons with double threshold current and K = 0, $z$ is the electron density in the active region normalized to the electron density with the threshold and K = 0 and $\xi$ is the normalized photon injection rate, wherein $\xi$ is so normalized that the number of photons in the resonator at $\xi = 1$ and $\eta = 0$ is just as large as without external photon injection and excitation of the laser with double threshold current, therefore as at $\xi = 0$ and $\eta = 2$.

For the stationary case, characterized by $dx/dt = 0$, $dz/dt = 0$, the solutions $$x = \xi + \eta - 1/2 + \sqrt{(\xi + \eta - 1)^2/2 + \xi} \quad (10)$$

$$z = 1 - \xi/x \quad (11)$$

are obtained from equations (8) and (9).

Figure 8:
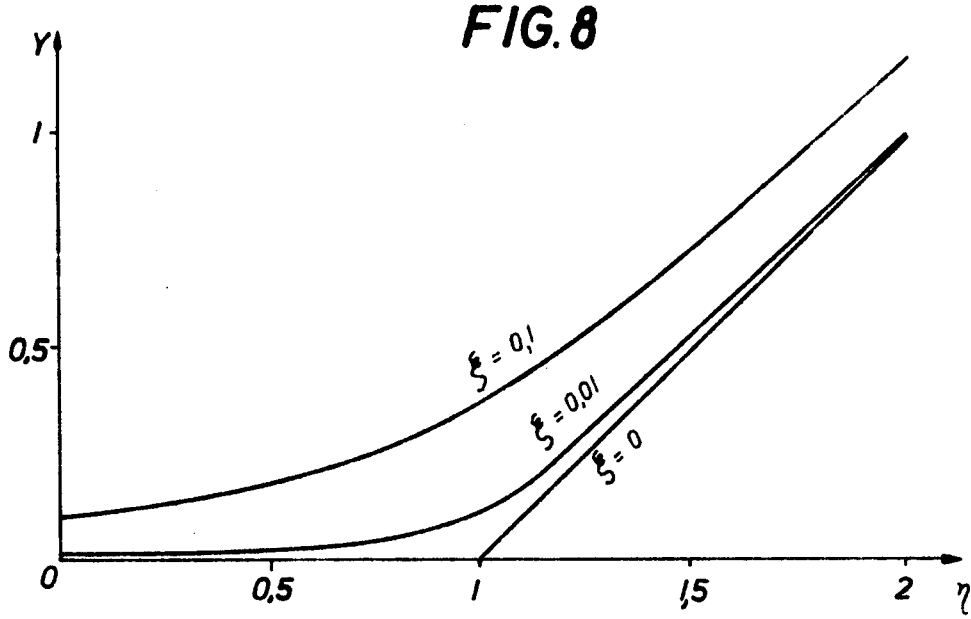
FIG. 8 is a graph showing normalized photon density against the normalized injection current for the arrangement.
Figure 9:
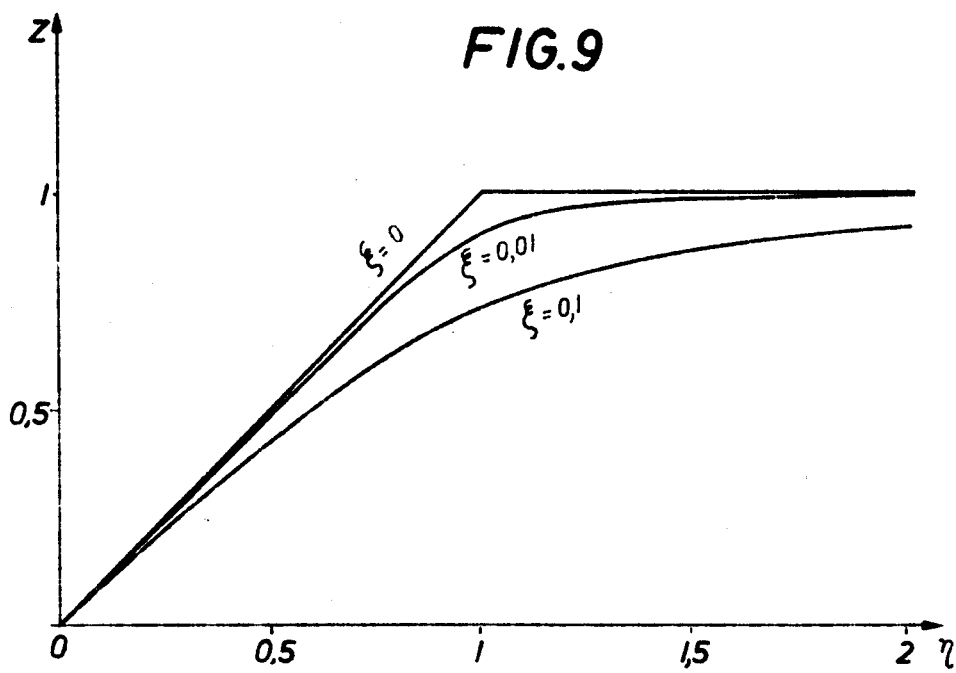
FIG. 9 is a graph showing the influence of external photon injection on the normed electron density.

In FIG. 8 the normalized photon density $x$ is drawn versus the normalized injection current $\eta$. The normalized external photon injection $\eta$ is a parameter. It may be seen that the external photon injection acts similarly to a strong proportion of spontaneous emission, inasmuch as the photon density rises when already below the threshold and also is increased above the threshold. In contrast to the curves which are achieved without additional photon injection but taking into consideration spontaneous emission, the curve for the photon density does not originate at injection current 0. In FIG. 9, the influence of the external photon injection on the normalized electron density z is shown. Without external photon injection ($\xi = 0$) the electron density rises in the active region of the laser linearly with the injection current, until the threshold is reached at z = 1. Since in the model the spontaneous emission is neglected, the mode can only oscillate if the total optical gain approaches infinity taking the optical feedback into consideration. If excitation is finite because of the spontaneous emission or by reason of coupling in external radiation, then a finite gain is sufficient to amplify the oscillations already present to any amplitude which may be maintained because of the pump rate. The result is that smaller normalized electron densities z belong to the appropriate values of the normalized injection current $\eta$, than without external excitation and without excitation by means of spontaneous emission. The neglect of spontaneous emission means ideal conditions which may be met in the monomode case, as in each mode the ratio of the rate of the stimulated emissions into the mode to the rate of spontaneous emissions into the mode is the same ratio of the number of photons in the mode to 1. If only one mode oscillates, then the number of photons in this mode is very large relative to 1. If a larger number of modes oscillates, then with the same total energy in the resonator the number of photons emitted by stimulation is approximately the same in size, the proportion of spontaneously emitted photons in the oscillating modes is now however larger by a factor equal to the number of modes.

In the case of external radiation of coherent light coupled into the laser, the spontaneous emission may be neglected if the externally radiated photon energy in the oscillating mode exceeds the radiation energy to a large extent owing to spontaneous processes. The reduction in electron density achieved by the external radiation and the reduction in optical amplification connected therewith lead to the fact that the optical amplification is no longer sufficient to build up strong coherent oscillations in other modes from the spontaneous emissions. Laser 2 is therefore optically synchronized by the external coherent radiation and may only oscillate in the mode which corresponds to the frequency of the external coherent radiation source.

Besides the influence of the external radiation on the spectral behaviour of laser 2 its influence on the transient behaviour is also of interest. For the following small signal calculation the ansatz $$x = x_o + x_1 e^{j\omega t} + x_1^* e^{-j\omega t} \quad (12a)$$

$$z = z_o + z_1 e^{j\omega t} + z_1^* e^{-j\omega t} \quad (12b)$$

$$\eta = \theta_o + \theta_1 e^{j\omega t} + \eta_1^* e^{-j\omega t} \quad (12c)$$

$$\xi = \xi_o + \xi_1 e^{j\omega t} + \xi_1^* e^{-j\omega t} \quad (12d)$$

is made. After inserting it into equations (8) and (9), by neglecting the mixed terms with the index 1, the equation $$\begin{pmatrix} \eta_1 \\ \zeta_1 \end{pmatrix} = \begin{pmatrix} 1 + x_o + j\omega\tau_1 & z_o \\ -x_o & -z_o + j\omega\tau_2 \end{pmatrix} \begin{pmatrix} z_1 \\ x_1 \end{pmatrix} \quad (13)$$

is obtained.

With the pre-condition that the external radiation is not modulated ($\xi_1 = 0$) follows from equation (13):

$$x_1 = \frac{x_o \eta_1}{\omega_o^2 + j\omega\beta - \omega^2} \quad (14)$$

with $$\beta \tau_1 = 1 + x_o + \tau_{1/\tau_2}(1 - z_o) \quad (15)$$

$$\omega_o^2 \tau_1 \tau_2 = 1 + x_o - z_o \quad (16)$$

Figure 10:
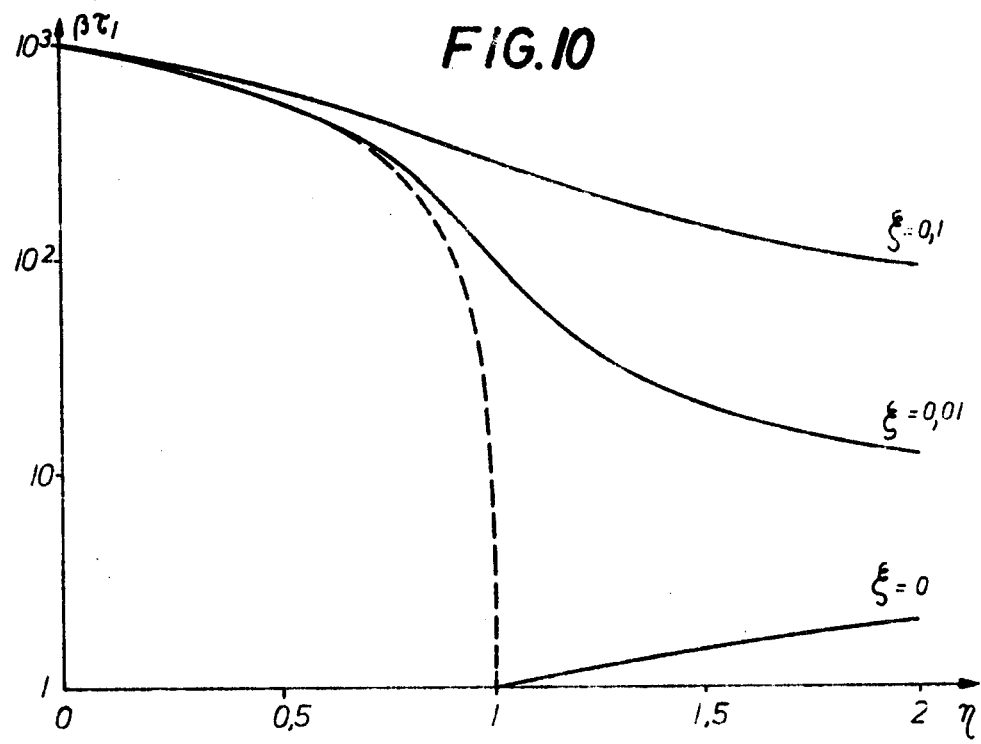
FIG. 10 is a graph showing the normalized damping constant against the normalized injection current.

The stationary values $x_o$, $z_o$ are given in dependence on $\eta_o$ and $\xi_o$ by the equations (10), (11), derived above. The normalized damping constant $\beta\tau_1$ and the normalized natural frequency $\omega_o \sqrt{\tau_1 \tau_2}$ are applied as parameters in FIGS. 10 and 11 depending on the normalized injection current $\eta_o$ and with the normalized radiation $\xi_o$. Thus a relationship of $\tau_1/\tau_2 = 1000$ was selected according to the realistic values $\tau_1 = 1$ nsec, $\tau_2 = 1$ ps. For $\xi_o = 0$ and $\eta < 1$, the laser does not produce any radiation, therefore the curves only have significance in this case as a limiting value for $\xi \to 0$ and are indicated in broken lines. From FIG. 10 it may be seen that the damping time constant $\beta^{-1}$ is of the magnitude of $\tau_1$ for the transient without external radiation. For the transient behaviour therefore the lifetime of the electrons is chiefly decisive because of the spontaneous recombination processes. With more recent double heterostructure lasers, the time constant is between 1 and 5 ns. Even with a twofold threshold current, this transient time only returns to half the value of $\tau_1$. With $\xi_o = 0.01$ a noticeable increase of $\beta$ is obtained. From FIG. 10 a damping time constant of $2\beta^{-1} = 3.34$ ns follows, for example, with a spontaneous electron lifetime $\tau_1 = 2$ ns and a photon lifetime $\tau_2 = 2$ ps for $\xi_o = 0$ and $\eta_o = 1.2$. With $\xi_o = 0.01$ and with the other parameters the same, the damping time constant drops to $2\beta^{-1} = 96$ ps. The transient now decays much quicker.

Figure 11:
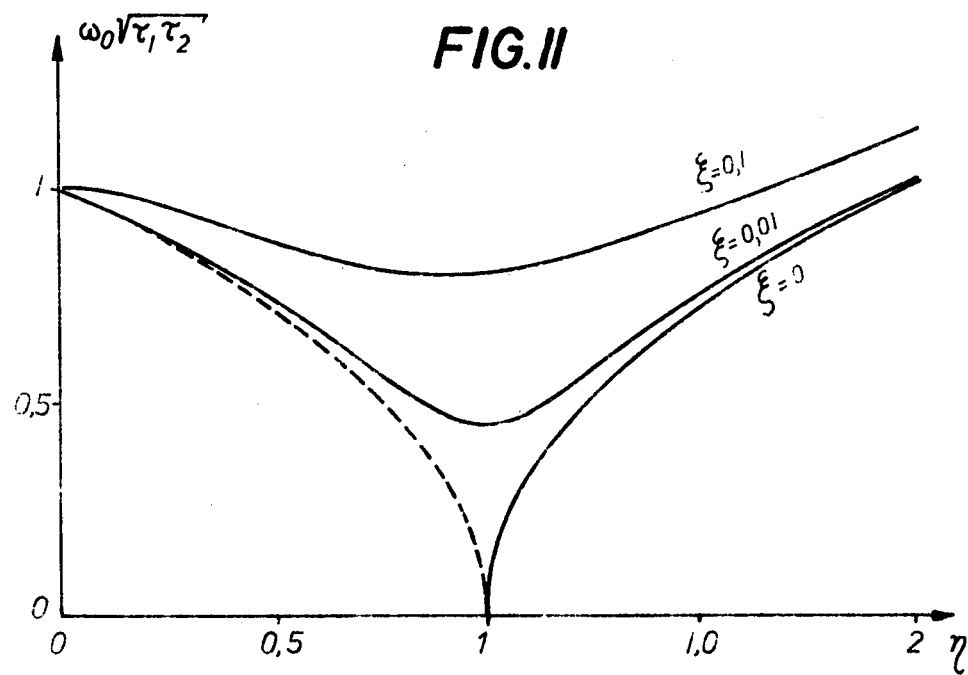
FIG. 11 is a graph showing the normalized natural frequency against the normalized injection current.

As can be seen from FIG. 11, the natural frequency $\omega_o$ does not return to the value 0 at the threshold. This advantage comes into consideration if the laser 2 is to be operated in the region of its threshold. In the above numerical example, the normalized natural frequency $\omega_o \sqrt{\tau_1 \tau_2} = 0.447$ for $\xi = 0$ and the value $\omega_o \sqrt{\tau_1 \tau_2} = 0.539$ is also obtained for $\xi_o = 0.01$. A relationship $2\omega_o/\beta = 23.56$ results for $\xi_o = 0$ and $2\omega_o/\beta = 0.826$ is obtained for $\xi_o = 0.01$. It may be seen that in the first case the transient is only weakly damped, but with a low external radiation damping already takes place aperiodically.

With a small $\xi_o$ first and foremost operation of laser 2 above the threshold comes into consideration. From equation (14) one can see that the modulation depth $x_1$ is proportional to the mean normalized number of photons $x_o$ in the resonator at a constant $\eta_1$. Since according to FIG. 8 at higher values of $\xi_o$, the number of photons already increases considerably below the threshold, and laser 2 may be driven below the threshold with a sufficiently strong external photon injection. It then operates only as an optical amplifier. From FIG. 11 it may be gathered that the damping constant is greater below the threshold and therefore more favourable. As, with a large $\xi_o$, the transition of the curves in FIGS. 9 - 13 of $\eta_o < 1$ to $\eta_o < 1$ takes place progressively, an exact distinction cannot be made either between the operation of laser 2 as a synchronized optical oscillator ($\eta_o < 1$) and as an optical amplifier ($\eta_o < 1$).

In the limiting case already indicated above, if laser 2 has nearly no reflective end surfaces, it operates purely as an optical amplifier, because the optical feedback is omitted. This case is not contained in the simplified theory shown here, because the balance equations are no longer valid, but, based on the previous reflections, it is plausible that the laser 2 as an active modulator has an extremely rapid aperiodic transient behaviour. Then, from the laser, the rise time is probably limited only by the propagation time of the optical wave in laser 2. The propagation time is in the region of a picosecond.

In summary it should be stated that by combining two injection lasers, one of which has the task of a coherent optical control oscillator and the second that of an active modulator, the modulation speed may be increased in the order of magnitude of one to three times, despite good properties of coherence.

Figure 12:
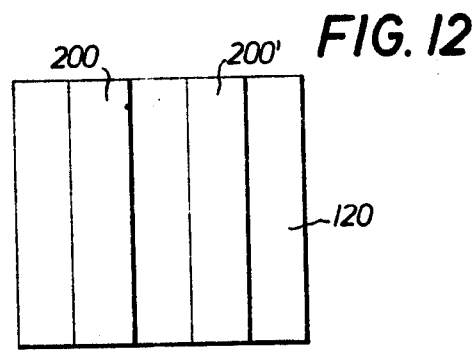
FIG. 12 is a plan view of a semiconductor body in accordance with a further arrangement according to the invention.
Figure 13:
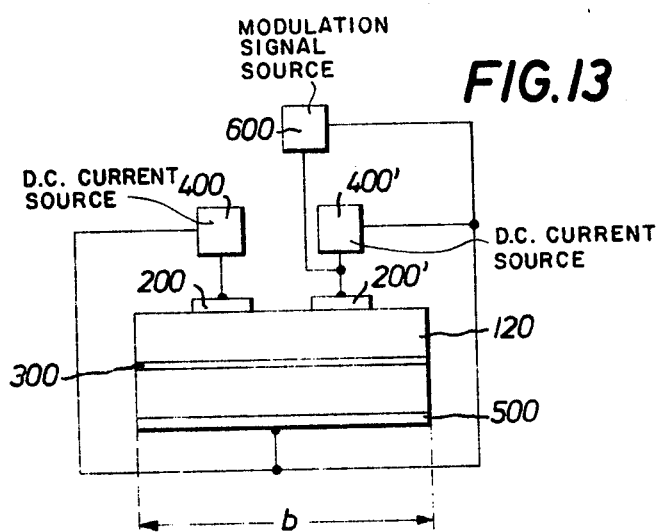
FIG. 13 is a view of the semiconductor body of FIG. 12 showing the connections thereto.
Figure 14:
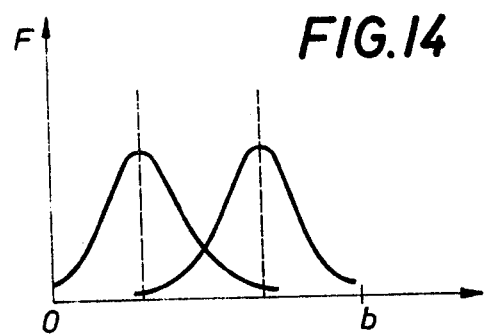
FIG. 14 shows graphically the formation of the electromagnetic field for the arrangement shown in FIGS. 12 and 13.

A further advisable laser arrangement for carrying out the method of the invention, which may be manufactured in integrated technology in a particularly simple and economic manner, is shown in FIGS. 12 to 14. This laser arrangement is characterized by a semiconductor body with a layer construction similar to a double heterostructure diode known per se with current supply contacts arranged on opposite outer surfaces, in which a current supply contact is constructed with a large surface and covers the total outer surface of the semiconductor body lying thereunder and in which two contact surfaces are arranged on the outer surface opposite the contact surface of the semiconductor body, which contact surfaces extend in the form of narrow strips running parallel at a small distance from one another and vertical to a face of the semiconductor body, which contains the light outlet surface.

Injection lasers with a current supply contact in strip form, for reducing the threshold current, are known per se and may be produced according to a tried method. The attachment of two such contact strips does not cause any difficult technical problems. The proposed laser arrangement is particularly suitable for manufacturing monolithically by integrated technology.

FIG. 12 shows a plan view of a semiconductor body 120, which is constructed from several layers which include a laser-active region and represent a double heterostructure diode known per se. The individual layers consist suitably of III–V compounds, for example gallium arsenide and gallium aluminium arsenide with varying types of conductivity in the individual layers of the diode. In order to supply the operating current, this semiconductor body 120 is provided on opposite outer surfaces with current supply contacts. A first current supply contact 500 (FIG. 13) is constructed with a large surface and covers the entire adjoining outer surface of the semiconductor body. This contact is suitably connected to a heat sink, not shown in FIG. 13, which removes the loss heat arising in operation of such an injection laser. Two further contact surfaces 200, 200' are arranged on the outer surface of the semiconductor body 120, which surface is opposite the large-area surface contacted by contact 500. The contact surfaces 200, 200' extend in the form of narrow strips running parallel to one another with a small spacing and vertical to a face of the semiconductor body 120 containing the light outlet surface 300. The first of these strip-like contacts 200 is connected to a terminal of an operating current source 400, the further terminal of which leads to the large-surface contact area 500. The second strip-like contact surface 200' is on the one hand connected to a terminal of a further operating current source 400' and on the other hand to a terminal of a modulation signal source 600. The further terminals of the operating current source 400' and the modulation signal source 600 also lead to the common large-area contact 500. The strip-like construction of the contact surfaces 200, 200' results in the fact that an operating current supplied to these contacts flows through the semiconductor body substantially only in a relatively narrow region, which is directly below each of these contact strips. However, as a result, only that part of the laser-active region of the semiconductor body 120 is excited through which this current passes. In a common semiconductor body 120, the laser arrangement shown in FIG. 13 produces two laser regions which may be controlled electrically independently of one another via the contact strips 200, 200' and which however are optically coupled together as is described below.

One of the injection lasers, in FIG. 13, the one having the strip contact 200, has a direct current constantly passing through it, the direct current being from an operating current source 400 and such that the laser is biased above the threshold value. By means of suitable formation of the faces assigned to this partial region of the semiconductor body 120, this partial laser has a relatively good optical quality. An optical resonator with good quality has already been formed by the cleavage surfaces of the semiconductor crystal. A further injection laser, to which a strip contact 200' is assigned, with a low optical quality in comparison to the first injection laser is biased on the one hand by a direct current from the operating current source 400', said direct current flowing through it, and in addition is controlled by a modulation current from the modulation signal source 600, said modulation current being superimposed on the direct current. It is desirable if the low optical quality of this partial laser is to be achieved to roughen or render non-reflecting the parts assigned to it of one or both faces.

The method in accordance with the invention for producing coherent mode pure radiation modulated at a high bit rate stipulates two injection lasers which may be controlled while separated electrically from one another, yet which are optically coupled. In FIG. 14, the spatial distribution of the electro-magnetic field in the region of the laser-active region of the semiconductor body 120 is shown in dependence on the width of the semiconductor body, which field is produced during excitation of the laser-active region via the strip-shaped contact surfaces 200,200'. The Figure clearly shows that peaks in field distribution are arranged to lie in the region of the laser-active region directly below the strip-like contact surfaces. In the regions of the semiconductor body 120 not directly covered by contact surfacrs 200,200' the field distribution produced falls off steeply. In the semiconductor body between the two strip-like contacts 200,200' however, the field components brought about by left or right partial laser, are superimposed. In this region optical coupling of the two partial systems takes place. The extent of the coupling may be influenced within certain limits by the distance between the strip-like contact surfaces 200,200'.

It will be understood that the above description of the present invention is susceptible to various modifications changes and adaptations.

What is claimed is:

1. A method of producing coherent mode pure radiation modulated at a high bit rate, by means of two injection lasers which may be controlled separately but are optically coupled, comprising:
passing a direct current through a first injection laser having a good optical quality (Q-factor) and good spectral purity of its output radiation, with said direct current being such that said first injection laser is pumped above its threshold value,
coupling the output radiation of said first injection laser to a further injection laser having a low optical quality in comparison to that of the first injection laser, and
operating said further injection laser in an oscillating mode to provide the desired modulated coherent mode radiation by biasing the further injection laser by passing a direct current through it and controlling the output radiation of said further injection laser additionally by superimposing a modulation current on its direct current.

2. The method defined in claim 1 wherein said step of biasing includes biasing said second laser near its threshold value by the direct current applied thereto, whereby the output radiation of said second laser oscillates according to modulation of the modulation current.

3. An arrangement for carrying out the method as defined in claim 1 comprising in combination: first and second semiconductor injection lasers with said second injection laser having a lower optical quality than that of said first injection laser, said first and second injection lasers being arranged with a small spacing therebetween to cause the output radiation emitted by an active region of said first laser to predominantly meet and be coupled to a laser-active region of said second laser, contacts for enabling separate currents to be supplied to said first and second lasers, a first operating current source connected to the contacts of said first laser for supplying a d.c. current to the said first laser to pump same above its threshold value; and means for operating said second laser in an oscillating mode including a second operating current source connected to the contacts of said second laser for supplying a d.c. current to said second laser to bias same, and means for superimposing a modulation current on the d.c. current supplied to said second laser.

4. An arrangement as defined in claim 3, and comprising a joint heat sink on which the semiconductors forming said first and second lasers are arranged, and which serves both as a joint return path for the operating current supplied to the lasers via further of said contacts.

5. An arrangement as defined in claim 3 and comprising a light waveguide, including a core and a sleeve, coupled to said second semiconductor injection laser to receive radiation emanating from the active region of said second laser.

6. An arrangement as defined in claim 3, and comprising a resonator arranged outside said first laser and coupled to said first laser for mode selection of the radiation emitted by said first laser.

7. An arrangement as defined in claim 6, wherein said resonator comprises a Fabry-Perot type resonator closed by parallel limiting mirrors.

8. An arrangement as defined in claim 6, and comprising a light waveguide element arranged at the smallest possible distance from a light outlet surface of said first laser for mode selection.

9. An arrangement as defined in claim 3, and comprising a transparent reflection reducing medium filling the space between said first and second lasers.

10. An arrangement as defined in claim 3 and comprising an optical isolator arranged between said first and second lasers for preventing an optical reaction of said second laser on said first laser.

11. An arrangement as defined in claim 3, wherein said first and second lasers comprise monolithically integrated components of a single semiconductor body.

12. An arrangement as defined in claim 11, and comprising a distributed feedback for at least one of said first and second lasers.

13. An arrangement as defined in claim 12, wherein said active region of said first laser has a periodic structure.

14. An arrangement for carrying out the method as defined in claim 1, comprising a semiconductor body including first and second optically coupled laser regions, said semiconductor body having a layer construction of a double heterostructure diode, and first, second and third current supply contacts arranged on the opposite major surfaces of said semiconductor body, said first current supply contact being of large area and covering one entire major surface of said semiconductor body, and said second and third contacts being arranged on the major surface of said semiconductor body opposite said one major surface covered by said first current supply contact, said second and third contacts extending in the form of narrow stripes running parallel to one another at a small spacing and vertical to an edge face of said semiconductor body containing a light outlet surface; means for causing the optical quality of the laser region between said first and third contacts to be lower than that of the laser region between said first and second contacts; a first operating current source means, connected between said first and second contacts, for supplying a d.c. current to said semiconductor body to cause the laser region between said first and second contacts to be pumped above its threshold value; and current supply means connected between said first and third contacts for supplying current to the laser region between said first and third contacts to cause same to operate in an oscillating mode, said current supply means including a second operating current source means for supplying a d.c. current for biasing the laser region between said first and third contacts, and means for superimposing a modulation current on the d.c. current from said second operating source means.

15. The arrangement as defined in claim 3 wherein said second operating current source means produces a d.c. current which biases said second laser near its threshold value, whereby the output radiation of said second laser oscillates according to the modulation of said modulation current.

16. A method of producing modulated coherent mode radiation comprising passing a direct current through a first injection laser of good optical quality (Q factor) and spectral purity to bias said first injection laser above its threshold value, optically coupling the output radiation of said first injection laser to a second injection laser of a lower optical quality than that of said first laser, and passing a direct current modulated by a superimposed modulation current through the second injection laser to cause said second injection laser to operate in an oscillating mode, to produce a modulated coherent mode output radiation.

17. An arrangement for producing modulated coherent mode radiation comprising a first injection laser of good optical quality and spectral purity; a second injection laser of lower optical quality than that of said first injection laser and coupled to said first injection laser for receiving radiation emitted by said first injection laser; means for passing a d.c. current through said first laser to cause same to be pumped above its threshold value; means for applying a d.c. current to said second laser to bias same near its threshold value; and means for superimposing a modulation current on said d.c. current for said second laser to cause the bias of second laser to oscillate about its threshold value, whereby said second laser produces a modulated coherent mode output radiation.

* * * * *